United States Patent
Danilin et al.

(10) Patent No.: US 9,395,633 B2
(45) Date of Patent: Jul. 19, 2016

(54) LITHOGRAPHIC CLUSTER SYSTEM, METHOD FOR CALIBRATING A POSITIONING DEVICE OF A LITHOGRAPHIC APPARATUS

(71) Applicant: ASML Netherlands B.V., Veldhoven (NL)

(72) Inventors: Alexander Alexandrovich Danilin, Eindhoven (NL); Alejandro Xabier Arrizabalaga Uriarte, Veldhoven (NL); Boris Menchtchikov, Eindhoven (NL); Alexander Viktorovych Padiy, Geldrop (NL)

(73) Assignee: ASML NETHERLANDS B.V., Veldhoven (NL)

( * ) Notice: Subject to any disclaimer, the term of this patent is extended or adjusted under 35 U.S.C. 154(b) by 44 days.

(21) Appl. No.: 14/413,394

(22) PCT Filed: Jun. 14, 2013

(86) PCT No.: PCT/EP2013/062361
§ 371 (c)(1),
(2) Date: Jan. 7, 2015

(87) PCT Pub. No.: WO2014/009100
PCT Pub. Date: Jan. 16, 2014

(65) Prior Publication Data
US 2015/0153657 A1 Jun. 4, 2015

Related U.S. Application Data

(60) Provisional application No. 61/670,023, filed on Jul. 10, 2012.

(51) Int. Cl.
*G03B 27/68* (2006.01)
*G03F 7/20* (2006.01)

(52) U.S. Cl.
CPC ........ *G03F 7/70633* (2013.01); *G03F 7/70516* (2013.01); *G03F 7/70725* (2013.01)

(58) Field of Classification Search
CPC ............ G03F 7/70516; G03F 7/70525; G03F 7/70541; G03F 7/70616; G03F 7/70633; G03F 7/70666; G03F 7/70675; G03F 7/70683; G03F 7/70725

USPC ............ 355/52, 53, 55, 72–77; 356/399–401; 250/492.1, 492.2, 492.22, 493.1, 548; 700/117, 121
See application file for complete search history.

(56) References Cited

U.S. PATENT DOCUMENTS 5,825,420 A * 10/1998 Yang ..................... G06F 17/147
348/250
6,317,211 B1 11/2001 Ausschnitt et al.
(Continued)

FOREIGN PATENT DOCUMENTS

EP 1 621 933 2/2006
EP 2 131 243 12/2009
(Continued)

OTHER PUBLICATIONS

International Search Report mailed Dec. 12, 2013 in corresponding International Patent Application No. PCT/EP2013/062361.
(Continued)

*Primary Examiner* — Christina Riddle
(74) *Attorney, Agent, or Firm* — Pillsbury Winthrop Shaw Pittman LLP

(57) ABSTRACT

A method of calibrating a substrate positioning system of a lithographic apparatus, the method including: exposing a pattern with the lithographic apparatus on an exposed layer on the surface of a substrate having a reference layer, wherein the pattern corresponds to a movement of the substrate by the substrate positioning system; measuring overlay data between the exposed layer and the reference layer on a plurality of positions on the substrate; transforming the overlay data from a spatial domain to a frequency domain by a discrete cosine transformation; modifying the overlay data in the frequency domain by selecting a subset of the overlay data; transforming the modified overlay data from the frequency domain back to the spatial domain by an inverse discrete cosine transformation; calibrating the substrate positioning system by using the modified overlay data in the spatial domain.

15 Claims, 3 Drawing Sheets

(56) References Cited

U.S. PATENT DOCUMENTS

| | | | |
|---|---|---|---|
| 6,766,211 B1* | 7/2004 | Ausschnitt | G03F 7/70633 438/14 |
| 6,928,628 B2 | 8/2005 | Seligson et al. | |
| 7,292,312 B2 | 11/2007 | Loopstra et al. | |
| 7,933,016 B2 | 4/2011 | Mieher et al. | |
| 8,149,387 B2 | 4/2012 | Alberti et al. | |
| 8,189,202 B2 | 5/2012 | Liesener et al. | |
| 8,446,564 B2 | 5/2013 | Hofmans et al. | |
| 8,988,658 B2 | 3/2015 | Van De Kerkhof | |
| 2002/0021755 A1* | 2/2002 | Hourunranta | H04N 19/89 375/240.12 |
| 2006/0023178 A1 | 2/2006 | Loopstra et al. | |
| 2006/0023194 A1* | 2/2006 | Loopstra | G03F 7/70458 355/72 |
| 2009/0180095 A1 | 7/2009 | Alberti et al. | |
| 2009/0296058 A1* | 12/2009 | Slotboom | G03F 7/70516 355/53 |
| 2009/0305151 A1 | 12/2009 | Hofmans et al. | |
| 2011/0164228 A1* | 7/2011 | Van De Kerkhof | G01N 21/211 355/18 |
| 2012/0191236 A1 | 7/2012 | Ausschnitt | |
| 2013/0014065 A1 | 1/2013 | Feng et al. | |

FOREIGN PATENT DOCUMENTS

| | | |
|---|---|---|
| JP | H10-070068 | 3/1998 |
| JP | 2005-529488 | 9/2005 |
| JP | 2006-054452 | 2/2006 |
| JP | 2009-170874 | 7/2009 |
| JP | 2009-302531 | 12/2009 |
| JP | 2011-181944 | 9/2011 |
| JP | 2011-525039 | 9/2011 |
| JP | 2012-089896 | 5/2012 |

OTHER PUBLICATIONS

Japanese Office Action dated Oct. 5, 2015 in corresponding Japanese Patent Application No. 2015-520871.

* cited by examiner

LITHOGRAPHIC CLUSTER SYSTEM, METHOD FOR CALIBRATING A POSITIONING DEVICE OF A LITHOGRAPHIC APPARATUS

CROSS-REFERENCE TO RELATED APPLICATIONS

This application is the U.S. national phase entry of International Patent Application No. PCT/EP2013/062361, filed Jun. 14, 2013, which claims the benefit of priority from U.S. provisional application 61/670,023, which was filed on Jul. 10, 2012, and which is incorporated herein in its entirety by reference.

FIELD

The present invention relates to a lithographic cluster system, method for calibrating a positioning device of a lithographic apparatus, and a measurement apparatus for use in the lithographic cluster system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion on a substrate, e.g., a silicon wafer. Transfer of the pattern is typically via imaging onto a layer of radiation-sensitive material provided on the substrate. In general, a single substrate will contain a network of adjacent target portions that are successively patterned. Conventional lithographic apparatus include so-called steppers, in which each target portion is irradiated by exposing an entire pattern onto the target portion at once. Conventional lithographic apparatus include so-called scanners, in which each target portion is irradiated by scanning the pattern through a radiation beam in a given direction, while synchronously scanning the substrate parallel or anti-parallel to this direction. It is also possible to transfer the pattern from the patterning device to the substrate by imprinting the pattern onto the substrate.

SUMMARY

After a pattern is transferred onto a substrate by a lithographic apparatus, the substrate may undergo other processing steps outside the lithographic apparatus. After these processing steps, a further pattern may be transferred onto the substrate. However, in a factory with multiple lithographic apparatus, it may be that the pattern and the further pattern are transferred onto the substrate by different lithographic apparatus. Each lithographic apparatus may have imperfections causing the pattern to be transferred with errors in e.g. shape and position. These errors cause an offset between the pattern and the further pattern. This offset is known as the overlay error. When the overlay error is too large, the integrated circuits made by the lithographic apparatus may malfunction. It may be beneficial to calibrate such overlay error beforehand to minimize the overlay error.

According to an embodiment of the invention, there is provided a method for calibrating a positioning device of a lithographic apparatus. The positioning device is arranged to position a substrate. The method comprises creating an exposed layer by exposing with the lithographic apparatus a pattern on a layer on the substrate, so as to create an exposed pattern on the layer. The substrate has a reference layer. The exposed pattern corresponds to a movement of the substrate by the positioning device. The method further comprises measuring overlay data between the exposed layer and the reference layer on a plurality of positions on the substrate. The method further comprises creating frequency domain data by transforming the overlay data from a spatial domain to a frequency domain by a discrete cosine transformation. The method further comprises creating a data subset by selecting a subset of the frequency domain data. The method further comprises creating calibration data by transforming the data subset to the spatial domain by an inverse discrete cosine transformation. The method further comprises calibrating the substrate positioning system by using the calibration data.

In another embodiment of the invention, there is provided a lithographic cluster system, comprising a lithographic apparatus and a measurement apparatus. The lithographic apparatus is for exposing a pattern on a substrate. The lithographic apparatus comprises a positioning device for moving the substrate. The measurement apparatus is configured to measure overlay data on a substrate. The lithographic apparatus is arranged to create an exposed layer by exposing the pattern on a layer on a substrate, so as to create an exposed pattern on the layer. The substrate has a reference layer. The exposed pattern corresponds to a movement of the substrate by the substrate positioning system. The measurement apparatus is arranged to measure overlay data between the exposed layer and the reference layer on a plurality of positions on the substrate. The measurement apparatus is further arranged to create frequency domain data by transforming the overlay data from a spatial domain to a frequency domain by a discrete cosine transformation, and to create subset data by selecting a subset of the frequency domain data. The measurement apparatus is further arranged to create calibration data by transforming the subset data to the spatial domain by an inverse discrete cosine transformation. The lithographic cluster system is arranged to calibrate the positioning device using the calibration data.

According to yet another embodiment of the invention, there is provided measurement apparatus for use in the lithographic cluster system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
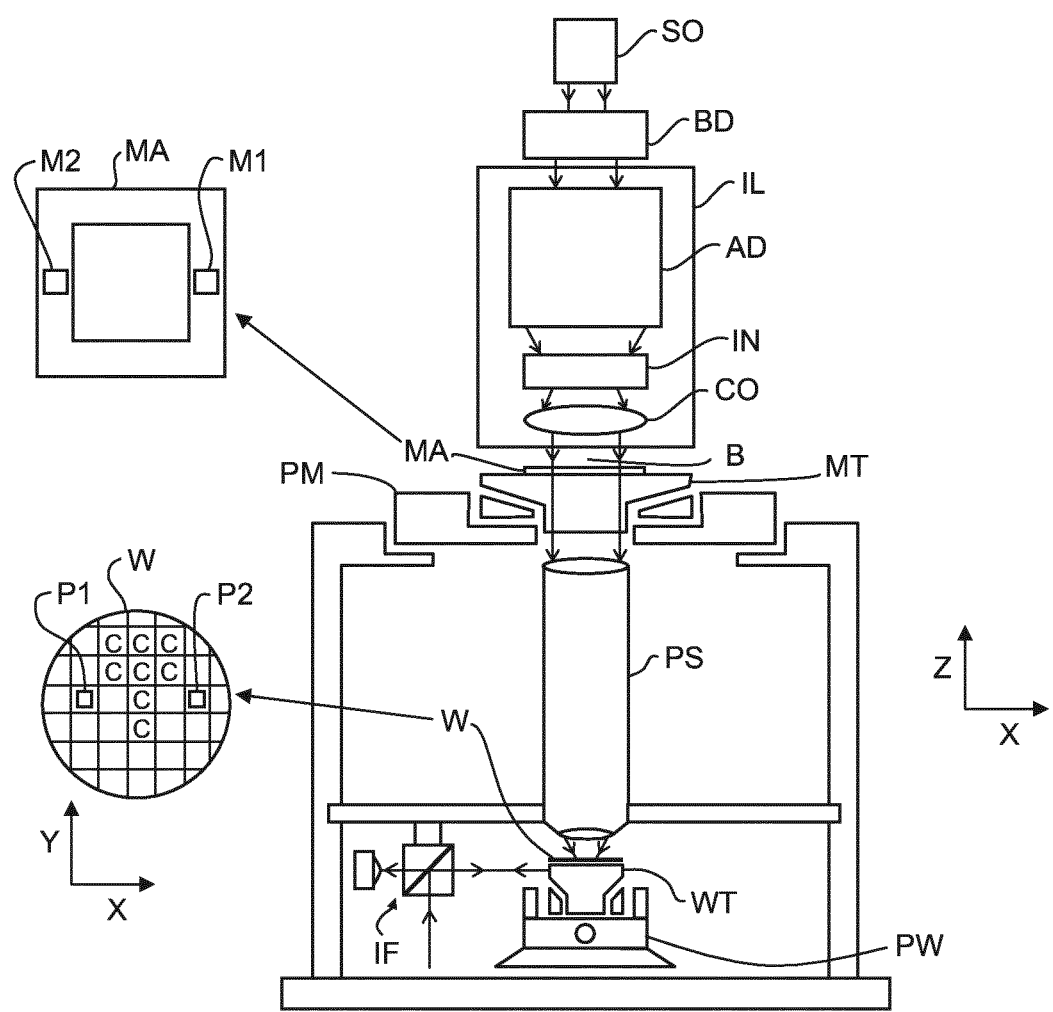
FIG. 1 depicts a lithographic apparatus in which an embodiment of the invention may be embodied.

FIG. 1 schematically depicts a lithographic apparatus according to one embodiment of the invention. The apparatus includes an illumination system IL, a support structure MT and first positioning device PM. The illumination system IL is configured to condition a radiation beam B. The support structure MT, e.g. a mask table, is constructed to support a patterning device MA, e.g., a mask. The support structure MT is connected to a first positioning device PM configured to accurately position the patterning device MA in accordance with certain parameters. The apparatus also includes a substrate table WT and a second positioning device PW. The substrate table WT is constructed to hold a substrate W, e.g., a resist-coated wafer. The substrate table WT is connected to the second positioning device PW configured to accurately position the substrate W in accordance with certain parameters. The apparatus further includes a projection system PS configured to project a pattern imparted to the radiation beam B by patterning device MA onto a target portion C of the substrate W.

The term "radiation beam" used herein encompass all types of electromagnetic radiation, including ultraviolet (UV) radiation, e.g., having a wavelength of or about 365, 248, 193, 157 or 126 nm), and extreme ultra-violet (EUV) radiation, e.g., having a wavelength in the range of 5-20 nm, as well as particle beams, such as ion beams or electron beams.

The illumination system IL may include various types of optical components, such as refractive, reflective, magnetic, electromagnetic, electrostatic or other types of optical components, or any combination thereof, for directing, shaping, or controlling radiation.

Referring to FIG. 1, the illumination system IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illumination system IL with the aid of a beam delivery system BD. In other cases the source SO may be an integral part of the lithographic apparatus, for example when the source SO is a mercury lamp. The source SO and the illumination system IL, together with the beam delivery system BD if required, may be referred to as a radiation system.

The illumination system IL may include an adjuster AD configured to adjust the angular intensity distribution of the radiation beam. In addition, the illumination system IL may include various other components, such as an integrator IN and a condenser CO. The illumination system IL may be used to condition the radiation beam, to have a desired uniformity and intensity distribution in its cross-section.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart the radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

As here depicted, the lithographic apparatus is of a transmissive type, e.g. employing a transmissive mask. Alternatively, the apparatus may be of a reflective type, e.g. employing a programmable mirror array of a type as referred to above, or employing a reflective mask.

The term "projection system" used herein should be broadly interpreted as encompassing any type of projection system PS, including refractive, reflective, catadioptric, magnetic, electromagnetic and electrostatic optical systems, or any combination thereof, as appropriate for the radiation beam B being used, or for other factors such as the use of an immersion liquid or the use of a vacuum.

The lithographic apparatus may be of a type having at least one substrate table WT and at least one support structure MT. In such machines, additional tables or supports may be used in parallel, or preparatory steps may be carried out on one or more tables or supports while one or more other tables or supports are being used for exposure. In addition to the at least one substrate table WT, the lithographic apparatus may have at least one table for holding measurement equipment.

The lithographic apparatus may also be of a type wherein at least a portion of the substrate may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS. Immersion techniques can be used to increase the numerical aperture of projection systems PS. The term "immersion" as used herein does not mean that a structure, such as a substrate, must be submerged in liquid, but rather only means that a liquid is located between the projection system PS and the substrate W during exposure.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioning device PW and position sensor IF, the substrate table WT can be moved accurately, e.g. so as to position different target portions C in the path of the radiation beam B. The position sensor IF may be an interferometric device, a linear encoder or a capacitive sensor. Similarly to the second positioning device PW, the first positioning device PM and another position sensor (which is not explicitly depicted in FIG. 1) can be used to accurately position the patterning device MA with respect to the path of the radiation beam B. In general, movement of the support structure MT may be realized with the aid of a long-stroke module and a short-stroke module, which form part of the first positioning device PM. The long-stroke module may move the short-stroke module over a large range with a low accuracy. The short-stroke module may move the supports structure MT relative to the long-stroke module over a small range with a high accuracy. Similarly, movement of the substrate table WT may be realized using a long-stroke module and a short-stroke module, which form part of the second positioner PW. In a stepper, as opposed to a scanner, the support structure MT may be connected to a short-stroke actuator only, or may be fixed. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between the target portions C. Similarly, in situations in which more than one die is provided on the patterning device MA, the patterning device alignment marks M1, M2 may be located between the dies.

The depicted apparatus could be used in at least one of the three following modes:

In the first mode, the so-called step mode, the support structure MT and the substrate table WT or are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In the second mode, the so-called scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width of the target portion in a single dynamic exposure, whereas the length of the scanning motion determines the height of the target portion C.

In the third mode, the support structure MT is kept essentially stationary holding a programmable patterning device MA, and the substrate table WT is moved or scanned while a pattern imparted to the radiation beam is projected onto a target portion C. In this mode, generally a pulsed radiation source is employed and the programmable patterning device MA is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
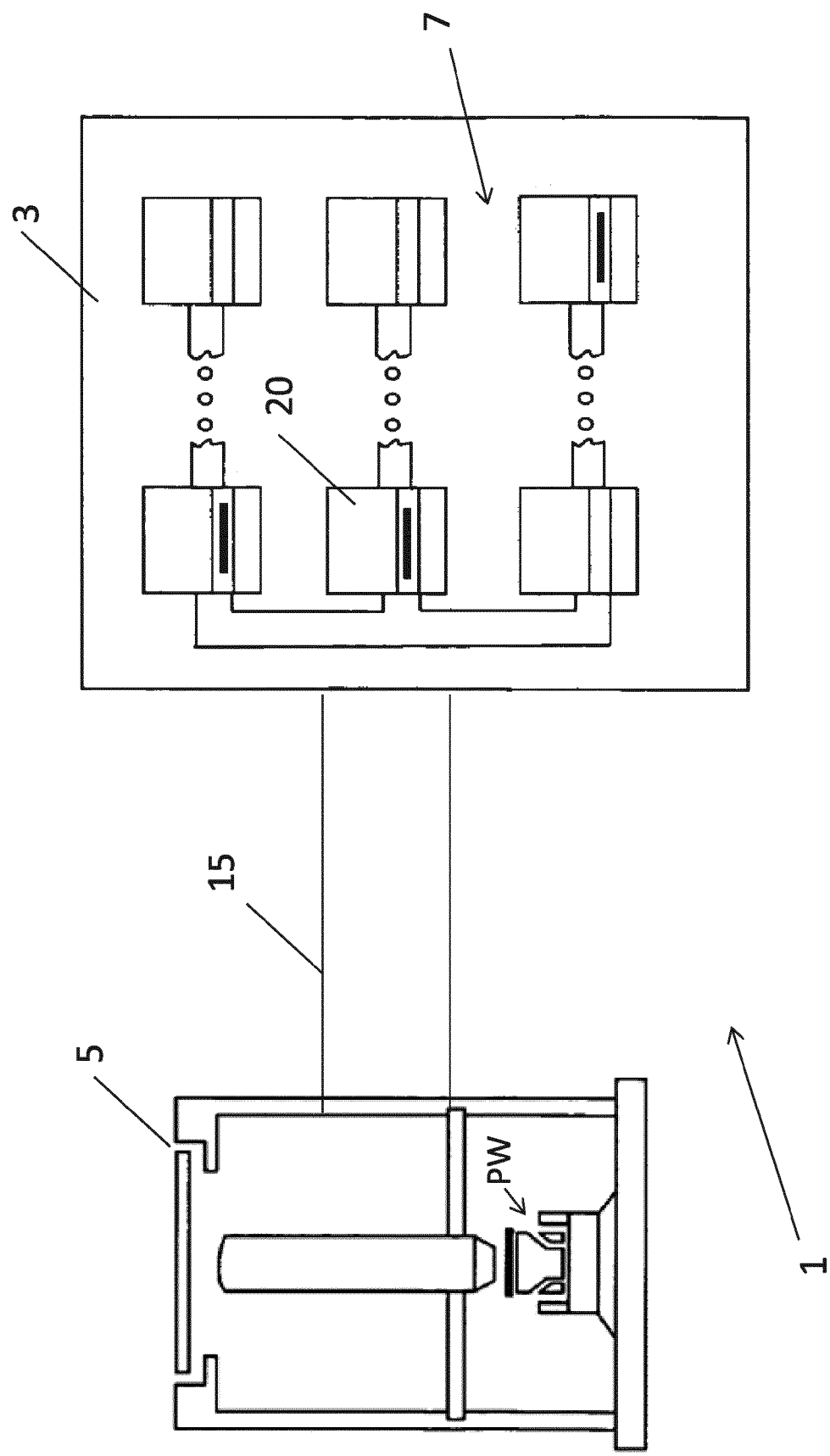
FIG. 2 depicts a lithographic cluster system according to an embodiment of the invention.

FIG. 2 schematically depicts a lithographic cluster system according to an embodiment of the invention. In FIG. 2, a lithographic cluster system 1 may comprise a lithographic apparatus 5 as shown in FIG. 1 and a track apparatus 3. The lithographic apparatus 5 may be configured to expose a pattern on a layer on a substrate W. The track apparatus 3 may comprise processing modules 20 configured to perform various processes before and/or after a pattern is exposed onto the substrate W. The lithographic cluster system 1 may comprise a wafer handling apparatus 15 for transporting a substrate W between the lithographic apparatus 5 and the wafer track apparatus 3.

The lithographic cluster system 1 may further comprise a measurement apparatus 7. The measurement apparatus 7 may be a metrology device, such as a Yieldstar™ apparatus. The measurement apparatus 7 may be either integrated into the lithographic apparatus 5 or interconnected with the track apparatus 3. In an embodiment, the measurement apparatus 7 may be used for measuring a position of an exposed pattern on a layer irradiated on a surface of a substrate.

The lithographic apparatus 5 may comprise the positioning device PW configured to position the substrate W. The positioning device PW may be configured to move the substrate W relative to the projection system PS. The positioning device PW may comprise a position detecting component, such as the position sensor IF, for determining a position of the substrate or the substrate table WT. In an embodiment, the position detecting component may be used for determining a position of an exposed pattern on a layer on a substrate W. In an embodiment, the position detecting component may be used for determining overlay data indicating an offset between two successive exposed patterns on substrate. This offset between two successive exposed patterns is known as the overlay error. The position sensor IF may be, for example, a one-dimensional or multi-dimensional position sensor. In an embodiment, the position sensor IF may be a two-dimensional position sensor in the x-y plane. The position sensor IF may be an optical encoder comprising a light source, a grating and a detector. The grating may be an encoder grid. The grating may be connected to the substrate table WT or to another component of the lithographic apparatus 5, such as a reference frame, a metrology frame or the projection system PS. The position detecting component may be configured to be calibrated to increase the accuracy thereof.

The measurement apparatus 7 may be used for measuring overlay data between two patterns. One of these patterns may be a reference pattern on a reference layer. The other pattern may be an exposed pattern on an exposed layer. The reference layer may be an etched layer already present on the substrate W. The reference layer may be generated by a reference pattern exposed on a first substrate table by a first lithographic apparatus 5. The exposed layer may be a resist layer exposed adjacent to the reference layer. The exposed layer may be generated by an exposure pattern exposed on a second substrate table WT by a second lithographic apparatus 5. The exposed pattern on the substrate W may correspond to a movement of the substrate W by the positioning device PW. The movement of the second substrate table WT may be different than the movement of the first substrate table WT, even when a similar pattern is exposed. This may be caused by a different setting of the positioning device PW of the second lithographic apparatus compared to the positioning device PW of the first lithographic apparatus. This different setting may cause a difference in position of the exposed layer and the reference layer on the substrate W. In an embodiment, the measured overlay data may also indicate an offset between the reference pattern and the exposure pattern.

The measured overlay data may be used as calibration data to calibrate the exposure pattern exposed by the second lithographic apparatus, such that after the calibration, the offset between the exposed layer and the reference layer may be minimized.

When calibrating the positioning device PW, it may be possible to exclude a certain range of spatial frequencies in order to cancel out the noise influence and to keep reliable data intact from previous calibrations. An example of such reliable data may be high-frequencies calibration data provided by an encoder grid's supplier. To exclude a certain range, an overlay matrix M2 may be formed by transforming the overlay data from the spatial domain to the frequency domain. The coefficients of overlay matrix M2 represent frequencies of the overlay data. A filter may be used to filter out high spatial frequency coefficients. Due to limited number of overlay data and the necessity to extrapolate the measured overlay data on the edges of the substrate, such exclusion of spatial frequencies may inevitably introduce undesired high gradient components on the edges of the substrate. The high gradient components may introduce unacceptable artifacts in a form of ringing, or may spoil the influence of extrapolated data on the edges of the substrate W. Moreover, if the encoder grid is a two-dimensional grid plate, it may be difficult to distinguish between different overlay errors in different directions.

Figure 3:
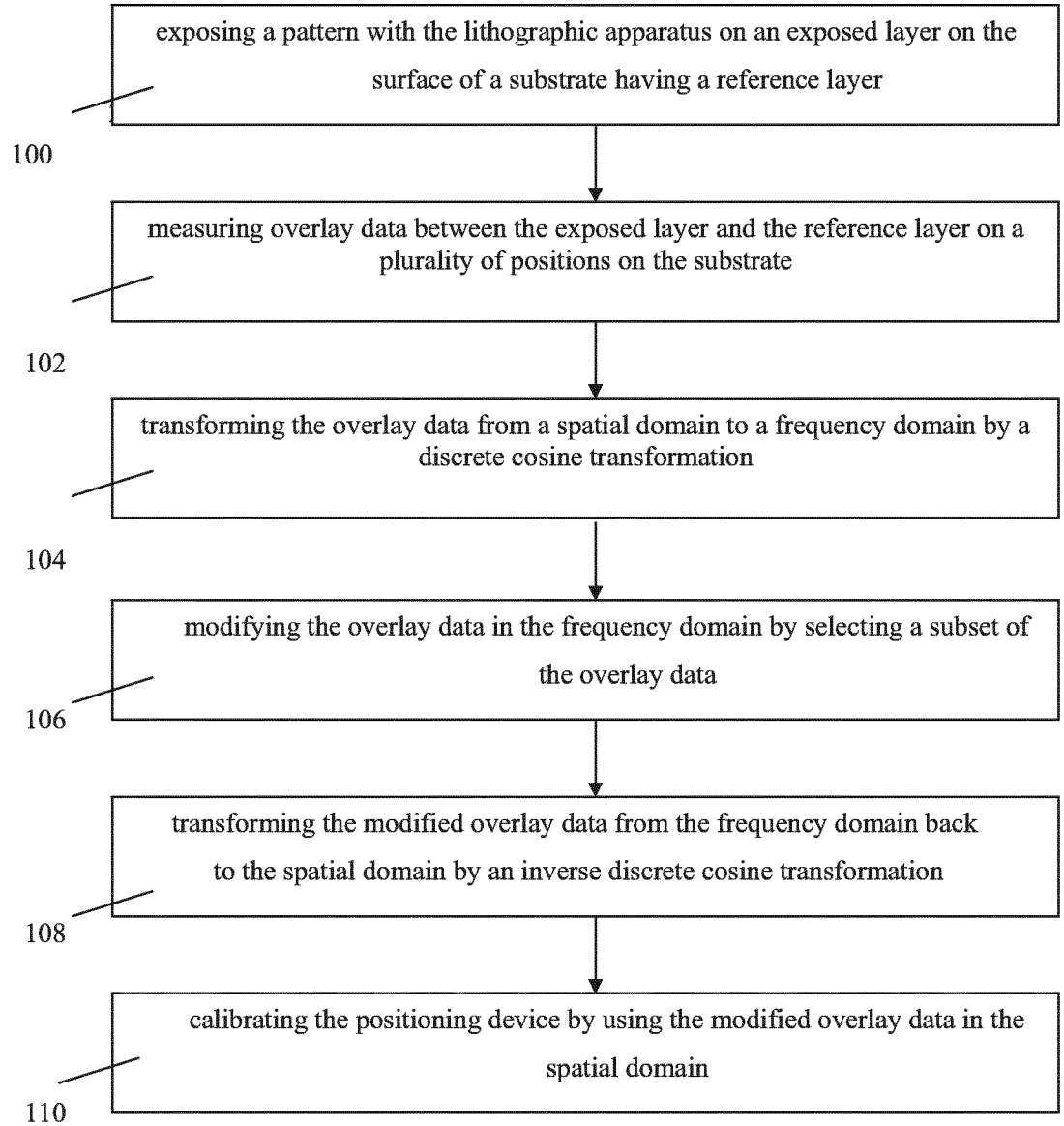
FIG. 3 depicts a method for calibrating a substrate positioning system of a lithographic apparatus according to an embodiment of the invention.

FIG. 3 discloses a method for calibrating a positioning device PW of a lithographic apparatus according to an embodiment of the invention.

In action 100, a pattern may be exposed on a layer on a substrate W, so as to create a exposed pattern on the layer. The substrate W has a reference layer with a reference pattern. The pattern may be generated by a lithographic apparatus 5. The pattern may correspond to a movement of the substrate W by the positioning device PW. The layer with the exposed pattern may be considered as an exposed layer. The exposed layer may be adjacent to the reference layer.

In action 102, overlay data between the exposed layer and the reference layer on a plurality of positions on the substrate W is measured. The overlay data may be in any forms, for example, an overlay matrix M1. The overlay matrix M1 may be a one dimensional matrix or a multi-dimensional matrix, e.g. two-dimensional matrix. The size of the overlay matrix M1 may correspond to the numbers of positions being measured on the substrate.

In an embodiment, action 102 may be performed by a component of the lithographic apparatus 5, such as the position sensor IF of the positioning device PW, or by a component of the lithographic cluster system 1, such as the measurement apparatus 7. In an embodiment, the overlay data may be stored either in the positioning device PW or in the measurement apparatus 7. In an embodiment, the overlay data may be directly used for calibrating the positioning device PW.

In action 104, frequency domain data is created by transforming the measured overlay data from a spatial domain to a frequency domain by a discrete cosine transformation. The frequency domain data may be in a form of an overlay matrix M2.

Discrete cosine transformation, namely DCT, is a Fourier-related transformation similar to the discrete Fourier transformation, namely DFT, but using only real numbers. The use of cosine functions rather than sine functions is critical for DCT: it may turn out that cosine functions are much more efficient, i.e. fewer functions may be needed to approximate a typical signal. DCT may be widely used in the field of image compression, where an important DCT property is utilized. The property is that all high-energy spatial frequencies coefficient are located together, for example on a top left corner of a DCT matrix, such as overlay matrix M2. The high-energy spatial frequencies may be zero frequencies coefficients or base frequencies coefficients which indicate the low-frequency components of the image.

By using DCT to create frequency domain data, a coefficient corresponding to overlay data with zero frequency or base frequency may be located on the top left corner of the matrix M2. This coefficient may indicate the average value of the overlay data for calibrating the positioning device PW. Beneficially, the DCT transformation may provide low gradients coefficients, i.e. smooth derivatives, and may provide for the overlay matrix M2. Moreover, the creation of frequency domain data using DCT may not suffer from the ringing. In action 104, the DCT may be of a DCT-II type. The coefficients of the overlay matrix M2 derived by the DCT-II may be determined by a formula as shown below:

$$X_k = \sum_{n=0}^{N-1} x_n \cos\left[\frac{\pi}{N}\left(n+\frac{1}{2}\right)k\right]$$

$k=0,\ldots,N-1$.

The DCT-II transformation may be equivalent to a DFT of 4N real inputs of even symmetry where the even-indexed elements may be zero. It may indicate that the -II transformation may be half of the DFT of the 4N inputs $y_n$, where $y_{2n}=0$, $y_{2n+1}=x_n$ for $0\leq n\leq N$, and $y_{4N-n}=y_n$ for $0\leq n\leq 2N$. It may be possible to further multiply the $x_0$ term by $1/\sqrt{2}$ and multiply the resulting matrix by an overall scale factor of $\sqrt{2/N}$. This may render the DCT-II matrix orthogonal, but may break the direct correspondence with a real-even DFT of half-shifted input. The DCT-II may imply the boundary conditions: $x_n$ is even around $n=-\frac{1}{2}$ and even around $n=N-\frac{1}{2}$; $x_k$ is even around $k=0$ and odd around $k=N$.

Each coefficient in the overlay matrix M2 may correspond to overlay data with a certain spatial frequency. The coefficients in the overlay matrix M2 may be arranged in a manner such that the coefficients located on the top left part of the overlay matrix M2 may correspond to overlay data with low spatial frequency and the coefficients located on the bottom right part of the overlay matrix M2 may correspond to overlay data with relatively high spatial frequency. In principal, the coefficient located on the top left corner of the matrix M2 in the frequency domain may correspond to overlay data with the zero frequency or the base frequency, which may indicate the average value of the overlay data for calibrating the substrate positioning system.

In an embodiment, action 104 may be performed by a component of the lithographic apparatus 5, such as the positioning device PW, or a component of the lithographic cluster system 1, such as the measurement apparatus 7.

In action 106, the subset data is created by selecting a subset of the frequency domain data. Creating the subset data may be done by creating an overlay matrix M3. The subset may be a submatrix N of the overlay matrix M2. The submatrix N may be a one dimensional matrix or a multi-dimensional matrix, e.g. two-dimensional matrix. The size of the submatrix N may be within a predefined range. In an embodiment, the data of the overlay matrix M3 located outside the selected subset may be zero.

Action 106 may be considered as a filtering process. The overlay data outside the submatrix N may indicate the overlay data desired to be filtered. The submatrix N may be an m-by-n matrix where the parameters m and n denote the number of rows and columns of the submatrix, respectively. In an embodiment, the value of the parameter m may be different from the parameter n, i.e. the submatrix N may be of a rectangular shape. Beneficially, this modification by filtering data outside the rectangular-shaped submatrix N may not introduce distortion to original data. The modification may keep residuals smaller, and thus may result in a better calibration result for the patterns located on the edges of the substrate.

In an embodiment, the value of the parameter m may be the same as the parameter n, i.e. the submatrix N may be a square matrix. The submatrix N may also indicate a subset data located in the overlay matrix M2 with a boundary of any shapes, e.g. a triangular shape, a trapezoidal shape, or a donut-like shape. Preferably, the submatrix N may be a square matrix.

In an embodiment, the overlay matrix M2 may be modified by attenuating data outside the submatrix N, e.g. setting data outside the submatrix N to a value below the value of data in the submatrix N. In this embodiment, the overlay matrix M3 may be created by modifying overlay matrix M2 by attenuating data outside the submatrix N.

The frequency domain data comprises high frequency data and low frequency data. The high frequency data represent high spatial frequencies, and the low frequency data represent low spatial frequencies. In an embodiment, the subset of the frequency domain data comprises the low frequency data. The high frequency data may be omitted by the subset. In an embodiment, selecting the low frequency data is done by locating the submatrix N on the top left part of the overlay matrix M2. Action 106 may be considered as a low-pass filtering process since the coefficients of overlay data with low frequency located on the top left part of the matrix M2 may be selected. When setting the data outside the submatrix N to zero, the coefficients of overlay data with high frequency data may be considered to be removed from the overlay matrix M2. Note that the more coefficients of overlay data may be removed from the overlay matrix M2, the more frequencies may be considered to be removed or deleted from the original overlay data.

In an embodiment, the size of the submatrix N, i.e. the parameters m and n, may be inversely proportional to a cut-off frequency. The cut-off frequency may denote the threshold of the spatial frequency of the overlay data to be filtered or deleted.

In an embodiment, the size of the submatrix N may be determined by a formula as shown below:

Assume the size of the substrate equals 400 times 400 square millimeter, and the corresponding overlay matrix M2 contains 401 times 401 elements, where the matrix pitch is 1 millimeter, If the coefficients of overlay data with spatial frequency higher than 20 cycles per millimeter are desired to be filtered, i.e. the cut-off frequency is 20 cycles per millimeter, the parameters m and n may be determined based on the following formula:

$m$=((the number of the row of the overlay matrix$-1$)/ the cut-off frequency)*2;

$n$=((the number of the column of the overlay matrix$-1$)/ the cut-off frequency)*2;

In this case, the parameter m=n=((401$-$1)/20)*2=40

This may indicate that only 40 times 40 coefficients in the submatrix N located on the top left part of the overlay matrix M in the frequency domain may be maintained.

In an embodiment, the submatrix N may be located on the bottom right part of the overlay matrix M2. In this manner, action 106 may be considered as a high-pass filtering process since the coefficients of overlay data with high spatial frequency located on the bottom right part of the overlay matrix M2 may be selected. When setting data outside the submatrix N to zero, the coefficients of overlay data with low frequency may be considered to be removed from the overlay matrix M2 in the frequency domain.

In an embodiment, the submatrix N may be located in the middle part of the matrix M2. In this manner, action 106 may be considered as a band-pass filter process since the coefficients located in the middle part of the matrix M2 may be selected. When setting data outside the submatrix N to zero, the coefficients of overlay data with zero frequency or base frequency and the coefficients of overlay data with a high spatial frequency may be considered to be removed from the overlay matrix M2 in the frequency domain.

In an embodiment, action 106 may be performed by a component of the lithographic apparatus 5, such as the positioning device PW, or by a component of the lithographic cluster system 1, such as the measurement apparatus 7.

In action 108, the overlay matrix M2 in the frequency domain may be transformed back to the spatial domain by an inverse discrete cosine transformation to create calibration data. The inverse discrete cosine transformation, namely IDCT, may be of a DCT-III type. The coefficients of the overlay matrix M2 derived by the DCT-III may be determined by a formula as shown below:

$$X_k = \frac{1}{2}x_0 + \sum_{n=1}^{N-1} x_n \cos\left[\frac{\pi}{N}n\left(k+\frac{1}{2}\right)\right]$$

k=0, ..., N$-$1

It may be possible to further multiply the $x_0$ term by $\sqrt{2}$ and multiply the resulting matrix by an overall scale factor of $\sqrt{2/N}$, so that the DCT-II and DCT-III may be transposed of one another. This may render the DCT-III matrix orthogonal, but may break the direct correspondence with a real-even DFT of half-shifted output. The DCT-III may imply the boundary conditions: $x_n$ is even around n=0 and odd around n=N; $x_k$ is even around k=$-\frac{1}{2}$ and even around k=N$-\frac{1}{2}$.

In an embodiment, action 108 may be performed by a component of the lithographic apparatus 5, such as the positioning device PW, or by a component of the lithographic cluster system 1, such as the measurement apparatus 7.

In an embodiment, the calibration data may be stored either in the positioning device PW or in the measurement apparatus 7.

In action 110, the positioning device PW may be calibrated by using the calibration data. In an embodiment, the encoder grid of the positioning device PW may be calibrated by using the calibration data. As a result, by using the calibrated positioning device PW, the offset between the exposed layer and the reference layer on the substrate may be minimized, especially on the edges of the substrate.

In an embodiment, the action 110 may be performed by the lithographic apparatus 5.

An example for carrying out the method for calibrating a positioning device PW as shown in FIG. 3 is explained below:

An 5-by-4 overlay matrix M1 in the spatial domain may be derived in accordance with action 102:

$$M1 = \begin{matrix} 99 & 97 & 101 & 93 \\ 98 & 92 & 97 & 103 \\ 90 & 94 & 95 & 92 \\ 93 & 103 & 102 & 100 \\ 99 & 95 & 98 & 99 \end{matrix}$$

An overlay matrix M2 in the frequency domain may be derived by transforming the overlay matrix M1 in the spatial domain via a discrete cosine transformation in accordance with action 104:

$$M2 = \begin{matrix} 433.7972 & -3.7894 & -1.7889 & 2.5378 \\ -1.7877 & 2.0771 & 1.1527 & 3.0279 \\ 5.4824 & 3.7775 & 1.9578 & 3.2236 \\ 2.2201 & 1.5472 & -9.2626 & -1.8368 \\ -7.9573 & 3.9634 & -2.3113 & 1.6064 \end{matrix}$$

A overlay matrix M3 in the frequency domain may be derived by selecting an 4-by-3 submatrix located on the top left part of the matrix M2 and setting coefficients located outside the 4-by-3 submatrix, namely the coefficients located on the last row and on the last column of M2, to zero in accordance with action 106:

$$M3 = \begin{matrix} 433.7972 & -3.7894 & -1.7889 & 0 \\ -1.7877 & 2.0771 & 1.1527 & 0 \\ 5.4824 & 3.7775 & 1.9578 & 0 \\ 2.2201 & 1.5472 & -9.2626 & 0 \\ 0 & 0 & 0 & 0 \end{matrix}$$

The overlay matrix M3 in the frequency domain may be transformed back to an overlay matrix M4 in the spatial domain in accordance with action 108:

$$M4 = \begin{matrix} 98.3510 & 100.1099 & 98.9936 & 95.6559 \\ 96.1800 & 92.3543 & 93.7568 & 99.5659 \\ 91.5793 & 95.1803 & 97.3905 & 96.9151 \\ 92.3871 & 100.4401 & 101.6710 & 95.3588 \\ 98.9671 & 96.6224 & 97.4810 & 101.0398 \end{matrix}$$

The overlay matrix M4 may be used to calibrate the positioning device PW. Compared with the overlay matrix M4 and M1 in the spatial domain, it may be observed that the modified overlay matrix M4 may provide a better, namely more precise, calibration result for the positioning device PW.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The substrate referred to herein may be processed, before or after exposure, in for example the track apparatus 3. The track apparatus 3 may comprise a tool that applies a layer of resist to a substrate and/or a tool that develops the exposed substrate W. Further, the substrate W may be processed more than once, for example in order to create a multi-layer IC, so that the term substrate W used herein may also refer to a substrate W that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing the method as disclosed above, or a data storage medium having such a computer program stored therein. The data storage medium may be a semiconductor memory, a magnetic disk or an optical disk.

The descriptions above are intended to be illustrative, not limiting. Thus, it will be apparent to one skilled in the art that modifications may be made to the invention as described without departing from the scope of the claims set out below.

What is claimed is:

1. A method for calibrating a positioning device of a lithographic apparatus, wherein the positioning device is arranged to position a substrate, the method comprising:
creating an exposed layer by exposing with the lithographic apparatus a pattern on a layer on the substrate, so as to create an exposed pattern on the layer, wherein the substrate has a reference layer, wherein the exposed pattern corresponds to a movement of the substrate by the positioning device;
measuring overlay data between the exposed layer and the reference layer on a plurality of positions on the substrate;
creating frequency domain data by transforming the overlay data from a spatial domain to a frequency domain by a discrete cosine transformation;
creating a data subset by selecting a subset of the frequency domain data;
creating calibration data by transforming the data subset to the spatial domain by an inverse discrete cosine transformation;
calibrating the positioning device by using the calibration data.

2. The method according to claim 1, wherein creating a data subset comprises setting data outside the subset to zero.

3. The method according to claim 1, wherein the frequency domain data is in the form of an overlay matrix, wherein a coefficient located on a top left corner of the overlay matrix corresponds to frequency domain data with a base frequency.

4. The method according to claim 1, wherein the frequency domain data comprises high frequency data and low frequency data, wherein the high frequency data represent high spatial frequencies, wherein the low frequency data represent low spatial frequencies, and wherein the subset comprises the low frequency data.

5. The method according to claim 1, wherein the frequency domain data comprises high frequency data, middle frequency data and low frequency data, wherein the high frequency data represent high spatial frequencies, wherein the low frequency data represent low spatial frequencies, wherein the middle frequency data represent a spatial frequency range between the low spatial frequencies and the high spatial frequencies, wherein the subset comprises the middle frequency data.

6. The method according to claim 1, wherein the frequency domain data is in the form of an overlay matrix, and the subset data is in the form of an overlay submatrix, and wherein the overlay submatrix is a square matrix.

7. The method according to claim 1, wherein the discrete cosine transformation is of an DCT-II type and the inverse cosine transformation is of an DCT-III type.

8. A lithographic cluster system, comprising:
a lithographic apparatus for exposing a pattern on a substrate, the lithographic apparatus comprising a positioning device for moving the substrate; and
a measurement apparatus configured to measure overlay data on a substrate;
wherein the lithographic apparatus is arranged to:
create an exposed layer by exposing the pattern on a layer on a substrate, so as to create an exposed pattern on the layer, wherein the substrate has a reference layer, wherein the exposed pattern corresponds to a movement of the substrate by the substrate positioning system device;
wherein the measurement apparatus is arranged to:
measure overlay data between the exposed layer and the reference layer on a plurality of positions on the substrate;
create frequency domain data by transforming the overlay data from a spatial domain to a frequency domain by a discrete cosine transformation;
create subset data by selecting a subset of the frequency domain data;
create calibration data by transforming the subset data to the spatial domain by an inverse discrete cosine transformation;
wherein the lithographic cluster system is arranged to calibrate the positioning device using the calibration data.

9. The lithographic cluster system according to claim 8, wherein the measurement apparatus is arranged to create the subset data by setting data outside the subset to zero in the frequency domain.

10. The lithographic cluster system according to claim 8, wherein the frequency domain data is in the form of an overlay matrix, wherein a coefficient located on a top left corner of the overlay matrix corresponds to frequency domain data with a base frequency.

11. The lithographic cluster system according to claim 8, wherein the frequency domain data comprises high frequency data and low frequency data, wherein the high frequency data represent high frequencies, wherein the low frequency data represent low frequencies, and wherein the subset comprises the low frequency data.

12. The lithographic cluster system according to claim 8, wherein the frequency domain data comprises high frequency data, middle frequency data and low frequency data, wherein the high frequency data represent high spatial frequencies, wherein the low frequency data represent low spatial frequencies, wherein the middle frequency data represent a spatial frequency range between the low spatial frequencies and the high spatial frequencies, wherein the subset comprises the middle frequency data.

13. The lithographic cluster system according to claim 8, wherein the frequency domain data is in the form of an overlay matrix, and the subset data is in the form of an overlay submatrix, and wherein the overlay submatrix is a square matrix.

14. The lithographic cluster system according to claim 8, wherein the discrete cosine transformation is of an DCT-II type and the inverse cosine transformation is of an DCT-III type.

15. A measurement apparatus arranged to:
measure, at a plurality of positions on a substrate, overlay data between an exposed layer on the substrate and a reference layer on the substrate, wherein the exposed layer is created by exposing with a lithographic apparatus a pattern on a layer on the substrate, wherein the exposed pattern corresponds to a movement of the substrate by a positioning device of the lithographic apparatus;
create frequency domain data by transforming the overlay data from a spatial domain to a frequency domain by a discrete cosine transformation;
create a data subset by selecting a subset of the frequency domain data; and
create calibration data by transforming the data subset to the spatial domain by an inverse discrete cosine transformation, wherein the calibration data is suitable for calibrating the positioning device.

* * * * *